United States Patent
Rahman et al.

(10) Patent No.: US 7,603,094 B2
(45) Date of Patent: Oct. 13, 2009

(54) DC OFFSET CORRECTION FOR DIRECT CONVERSION RECEIVERS

(75) Inventors: Mahibur Rahman, Lake Worth, FL (US); Charles L. Sobchak, Davie, FL (US)

(73) Assignee: Freescale Semiconductor Inc., Austin, TX (US)

( * ) Notice: Subject to any disclaimer, the term of this patent is extended or adjusted under 35 U.S.C. 154(b) by 569 days.

(21) Appl. No.: 11/452,457

(22) Filed: Jun. 14, 2006

(65) Prior Publication Data

US 2007/0293180 A1    Dec. 20, 2007

(51) Int. Cl.
*H04B 7/00* (2006.01)
*H04Q 7/20* (2006.01)

(52) U.S. Cl. ............... 455/241.1; 455/253.2; 455/296; 455/324

(58) Field of Classification Search ... 455/234.1–234.2, 455/241.1, 245.1, 253.1, 296, 310, 324, 253.2; 375/345, 346
See application file for complete search history.

(56) References Cited

U.S. PATENT DOCUMENTS

| | | | |
|---|---|---|---|
| 6,240,100 B1 * | 5/2001 | Riordan et al. | 370/442 |
| 2004/0146128 A1 | 7/2004 | Cuje et al. | |
| 2006/0222117 A1 * | 10/2006 | Rahman et al. | 375/345 |

* cited by examiner

*Primary Examiner*—Lee Nguyen
(74) *Attorney, Agent, or Firm*—Charles W. Bethards (57) ABSTRACT

A direct current (DC) offset correction system for a direct conversion receiver and corresponding receiver and methods facilitate reduction of DC offsets in such receivers. One method includes calibrating a DC offset correction system in a closed loop configuration over each of a plurality of gain settings to provide a plurality of offset data for an operating mode of the direct conversion receiver; selecting one of the plurality of offset data based on a current gain setting of the direct conversion receiver as supplied, e.g., by an AGC system; and operating the DC offset correction system in an open loop configuration using the one of the plurality of offset data to correct for a DC offset in the direct conversion receiver.

19 Claims, 4 Drawing Sheets

DC OFFSET CORRECTION FOR DIRECT CONVERSION RECEIVERS

FIELD OF THE INVENTION

This invention relates in general to communication equipment and more specifically to techniques and apparatus for determining and correcting a Direct Current (DC) offset in direct conversion (zero IF or very low frequency IF) receivers.

BACKGROUND OF THE INVENTION

Offset issues, such as DC offset in direct conversion (or low IF) receivers is a known concern that normally must be dealt with in order for these receivers to operate properly in communication systems. DC offset may be viewed as an error term that ends up added to and as part of a received signal. These offsets can result from various sources, including various mismatches within a receiver lineup, e.g., mismatches in quadrature mixers or other mismatches in other circuitry such as amplifiers, filters, and the like. These mismatches may be more pronounced in receiver lineups that are implemented substantially in integrated circuit form since techniques, such as suitable blocking capacitors, are not readily available to mitigate the DC error terms.

It may be important to rapidly and accurately determine and correct for these DC offsets in order to minimize signal acquisition times and the like. In many situations, such as relatively short symbol rate modulation and discontinuous transmission or signals with varying signal strength (changing gain control and thus transients), conventional techniques for determining DC offset do not allow for a rapid and accurate determination of DC offset. Conventional techniques generally include evaluating statistical properties, such as an average of the signal and this can be used in a DC offset correction loop. Averaging for a sufficient period of time to insure accuracy does not provide a DC offset determination in the appropriate time frame for many applications. Furthermore DC offset correction loops with practical bandwidths often have excessive settling time, i.e., long transient times and degraded receiver performance, for many applications.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

In overview, the present disclosure concerns communication equipment, e.g., fixed equipment, mobile or portable devices. By way of example, techniques and apparatus for determining and correcting for Direct Current (DC) offset in receivers, e.g., direct conversion receivers that are arranged and constructed for receiving signals with a base band section or portion operating at or near 0 Hz or with a very low intermediate frequency (zero IF receiver). More particularly various inventive concepts and principles embodied in methods and apparatus, e.g. communication devices, systems and receivers, and integrated circuits, for initializing a DC offset correction system or feedback circuit with course offset data, quickly calibrating the system or circuit in a closed loop configuration and then operating the system or circuit in an open loop configuration at one of a plurality of gain settings will be discussed and disclosed.

The communication equipment or devices of particular interest may vary widely but include handsets, messaging devices and other equipment that include a receiver for facilitating wireless connectivity. Such receivers, specifically direct conversion or zero or low IF receivers, are subject to DC offsets do to various non ideal elements and component matches. In systems, equipment and devices that employ direct conversion receivers for receiving non continuous signals or in situations where the receiver must quickly acquire and correct for any DC offsets, the apparatus and methods described below can be particularly advantageously utilized, provided they are practiced in accordance with the inventive concepts and principles as taught herein.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Figure 1:
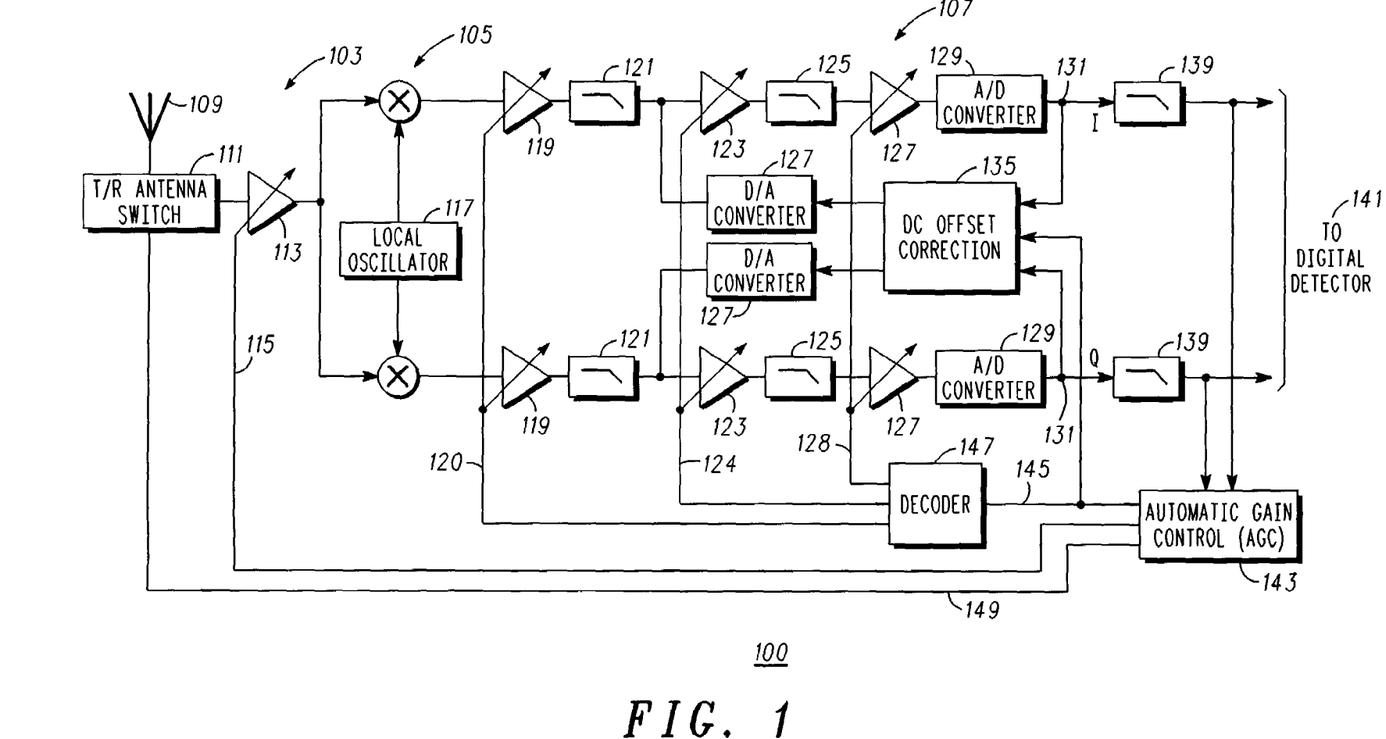
FIG. 1 depicts in a simplified and representative form, a high level diagram of a direct conversion receiver including a Direct Current (DC) offset correction and automatic gain control (AGC) system in accordance with one or more embodiments.

Referring to FIG. 1, a simplified and representative high level diagram of a direct conversion receiver including a Direct Current (DC) offset correction and automatic gain control (AGC) system in accordance with one or more embodiments will be briefly discussed and described. In FIG.

1, a direct conversion receiver 100 including a front end 103, coupled to a quadrature mixer 105 and further coupled to a zero or near zero intermediate frequency (IF) backend 107 is shown. In the front end 103, a received signal at a radio carrier frequency (RF signal), i.e., signal from an antenna 109, is coupled via a transmit receive switch 111 to a low noise amplifier (LNA) 113. The LNA 113 can be a variable gain amplifier or, as shown, a switched gain amplifier with a gain that can be changed via a control signal at 115 in one step, e.g., by 16 dB or a plurality of typically smaller discrete steps. The LNA 113 is used to amplify the RF signal and can also be used to select a particular radio band, i.e., facilitate a mode of operation for the receiver via known filters (not specifically shown). The output of the LNA is coupled to the mixer 105 (typically referred to as a quadrature mixer) that is driven by a local oscillator 117 (one output phase shifted by 90 degrees) to provide an I (in-phase or real following top path in FIG. 1) and Q (quadrature or imaginary following bottom path in FIG. 1) signal to respective post mixer amplifiers 119. The local oscillator (generally known frequency synthesizer in practice) operates at a frequency that is nominally equal to or near the frequency of the RF signal and thus the output signals (desired portion) from the mixer are nominally at 0 Hz or near 0 Hz plus any frequency error.

The post mixer amplifiers 119 are generally known variable gain amplifiers with a gain that can be changed via gain control signal 120 over a range of, e.g., 15 dB in non-uniform steps of 2.5 to 3.5 dB each. The post mixer amplifiers 119 are coupled to filters 121, e.g., low pass filters with a bandwidth selected to correspond to the bandwidth of the RF signal where these filters operate to provide adjacent channel and anti-aliasing selectivity. The outputs from these filters are coupled to further amplifiers 123 that are shown with variable gain where this gain can be changed (via gain control signal 124), e.g., over a 15 dB range in non-uniform steps of 2.5 to 3.5 dB each. The outputs from amplifiers 123 are coupled to additional low pass filters 125 that can be similar to filters 121 and provide additional selectivity. The output of filters 125 can be coupled to additional amplifiers 127 that are also variable gain amplifiers with a gain range (gain controlled via signal 128) and step sizes similar to amplifiers 123, 119. The plurality of variable gain amplifiers and filters distributed within the backend 107 is one way of enhancing dynamic range in the presence of interferers, particularly when the receiver is operating at low supply voltages, e.g., in the 1 volt range.

The outputs of the additional amplifiers 127 drive respective Analog to Digital converters (ADC) 129, to provide I samples at the output 131 and Q samples at the output 133. In some embodiments the ADC can be a sigma delta based ADC operating, for example, to provide 12 bit samples at a 24 MHz rate. The ADCs, as known, have a finite dynamic range and for many receiver applications must provide significant output resolution over a relatively large signal amplitude range. Thus any DC offset at the input to the ADC 121 can detract from the dynamic range or otherwise contribute to non linear performance. Thus any DC offset normally must be removed or reduced or otherwise mitigated in some fashion prior to the input to the ADCs.

In any event, the I and Q samples are coupled to a DC offset correction system 135 as well as respective channel filters 139. The DC offset correction system, as will be described in further detail below, operates to detect and determine the level of any DC offset in the I path and in the Q path and provide signals via the digital to analog converters 137 to, e.g., an input to the amplifiers 123, so as to reduce the DC offset at the input to the ADCs. The channel filters operate to provide additional selectivity and normally have a corner frequency selected for compatibility with a subsequent down sampling process (not specifically shown) with the outputs of channel filters 135 coupled to further digital detection processes 141, such as demodulation, decoding, and the like that are not relevant to this disclosure.

The outputs from the channel filters are also coupled to an automatic gain control (AGC) system 143 where the power or amplitude level of the signal corresponding to the samples is determined, e.g., as a sum of squares or the like with appropriate filtering, etc. as is known. This power level is used to generate a gain control signal at 145 and 115, where the control signal at 115 switches the gain of the LNA 113, e.g., in one embodiment up or down by 16 dB, and the gain control signal at 145 is coupled to a decoder 147. The decoder 147 performs a mapping function to convert the gain control signal at 145 to respective, gain control signals at 120, 124, 128. The AGC system 143 or corresponding logic can also be used to provide a control signal at 149 to control the antenna switch so as to switch between receive and transmit modes of operation.

The decoder by way of example, provides a set of gain control signals 120, 124, 128 based on the signal level or value at 145 and gain status and non uniform gain control steps of the amplifiers 119, 123, 127, such that an appropriately limited or leveled signal amplitude is provided or presented to the ADCs 129. For example, due to the non uniform gain changing steps of the amplifiers 119, 123, 127 a signal increase may result in a gain reduction at amplifier 123 and a gain increase at amplifier 119. The non uniform gain steps result from a desire to save as much die space as possible and thus constraints on resistor sizes that can be used in resistor arrays that implement the amplifiers and gain control portions thereof. Those of ordinary skill will appreciate these limitations and given a particular embodiment of the amplifiers and gain control step sizes will be readily able to develop an appropriate look up table, i.e., decoder, that can be used to convert the signal at 145 to respective gain control signals 120, 124, 128.

Also a technique referred to as gain replacement is employed by the AGC system 143. Gain replacement is used so that a well controlled signal level is provided to the ADCs 129 over as large a range of a radio frequency signal amplitude as is practical. Gain replacement is used so that when the gain of the LNA is decreased as a result of the radio frequency signal increasing, by its step size, e.g., 16 dB, the gains of the amplifiers 119, 123, 127 are reset, i.e., increased, so that the signal level at the ADCs remains essentially equal to the level before the step change at the LNA. When the radio frequency signal decreases enough to increase the gain of the LNA, e.g., by 16 dB, the gains of the amplifiers will similarly be decreased.

Some embodiments of the receiver zero IF backend as described above utilize a plurality of amplifiers, e.g., three amplifiers 119, 123, 127 as described above, to appropriately distribute gain so as to avoid any non linear regions, e.g., compression, and to maintain high signal to noise ratios throughout the base band or backend portion of the receiver. This may be particularly important when the receiver and specifically backend are implemented in low supply voltage, e.g., 1.5 volt, integrated circuit technologies or configurations. The low voltage implementations can limit dynamic range as well as gain control range of any particular amplifier or other functional stage (filter, ADC, etc) and thus to provide appropriate overall gain control ranges and other performance criteria, multiple amplifiers may be used.

Furthermore, each time a gain change occurs in the LNA or backend amplifiers 119, 123, 127, the DC offset correction system is expected to quickly remove or reduce any DC offset. Note that these gain changes, particularly large changes necessarily change the DC offset. For example, any DC offset at the output of the mixer 105 is amplified by all of the backend amplifiers and thus if the gain of these amplifiers change the DC offset at the ADCs 129 necessarily changes. It will be appreciated that the particular change in this DC offset will depend on the change in gain of the specific ones of the LNA and backend amplifiers and can thus be relatively complicated to determine. The gain changes and resultant DC transients can create problems in known closed loop DC offset correction systems since they operate in a closed loop configuration and normally must have relatively low loop bandwidths, e.g., less that 1 KHz, so that desired low frequency modulation components are not unduly distorted, etc. Thus the closed loop operation of the DC offset correction system may take relatively long periods of time to track and remove or reduce the DC offset. During this time the DC transients can cause clipping or other undesired non linear operation of one or more of the stages in the receiver backend.

As one example, HSDPA (High Speed Downlink Packet Access) systems require a frequency response that is relatively flat for any signal components greater than 1 KHz (setting maximum loop bandwidth of DC offset correction system) in order to insure a desired EVM (Error Vector Magnitude) performance. The HSPDA system and others (wideband Code Division Multiple Access, Enhanced Global Packet Radio Systems, etc.) can require receiver warm up times (time until receiver is providing accurately demodulated data) that are less than 100 micro seconds, which establishes or sets a response time constraint for the DC offset correction system. Furthermore, if the receiver has to track fading in the radio frequency signal the required response times may be even shorter. It may also be instructive to realize that not only does the DC offset correction need to be fast it also needs to be relatively effective at eliminating DC offset. For example, as little as 2 milli volts (mv) of DC offset at the input of amplifier 119 can result in over 300 mv of DC offset at the input to the ADCs 129. In 1.5 volt systems, this is a large percentage of the available dynamic range of the ADCs and thus needs to be substantially reduced.

Figure 2:
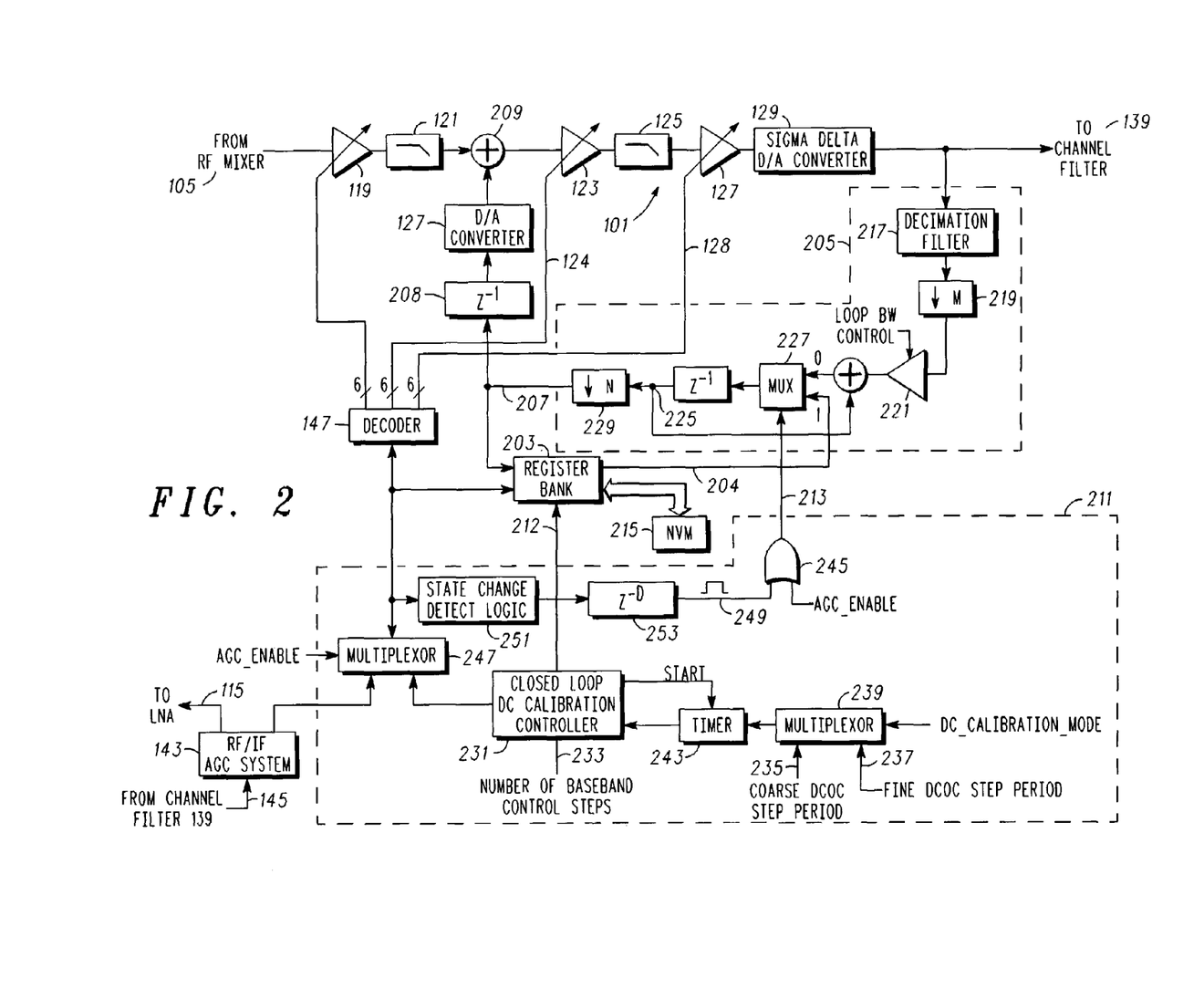
FIG. 2 in a representative form, shows a diagram of a near zero frequency backend portion of the receiver of FIG. 1 including a more detailed diagram of the DC offset correction system inter coupled with the AGC system, in accordance with one or more embodiments.

Referring to FIG. 2, a representative diagram of a near zero frequency backend portion of the receiver of FIG. 1 including a more detailed diagram of the DC offset correction system inter coupled with the AGC system, in accordance with one or more embodiments will be discussed and described. FIG. 2 represents either the I or Q path from FIG. 1 and it will be appreciated that the receiver functions are repeated for the other path. As noted above with reference to FIG. 1, the backend 107 is part of a direct conversion receiver that includes DC offset correction and further comprises a radio frequency front end 103 coupled to a mixer 105 where the mixer 105 and signals from the mixer are further coupled as shown to the zero or near zero frequency backend (backend) 107. As noted above, the near zero frequency backend comprises, among other depicted circuits, filters, etc, a plurality of variable gain amplifiers 119, 123, 127 where these amplifiers may be referred to respectively as a post mixer amplifier, IF amplifier, and base band amplifier.

The direct conversion receiver further includes the automatic gain control (AGC) system 143 that is coupled to the near zero frequency backend, e.g., via the channel filters 139. The AGC system is configured to provide a gain signal at 145 that is used to set the gains of the plurality of variable gain amplifiers 119, 123, 127 as well as the LNA 113. Further included in the direct conversion receiver is the DC offset correction system 135. In one or more embodiments, the DC offset correction system is configured for various operations including initialization with initial offset data corresponding to a plurality of gain settings of the direct conversion receiver, operation in a closed loop configuration at each of the plurality of gain settings to provide a corresponding plurality of offset data, and operation in an open loop configuration using first offset data corresponding to a first gain setting for the variable gain amplifiers as provided by the AGC system to reduce DC offset in the near zero frequency backend. Additionally, the DC offset correction system is further configured to respond to a change, provided by the AGC system, e.g., from the first gain setting to a second gain setting for the variable gain amplifiers, and does so by operating in the open loop mode using second offset data corresponding to the second gain setting. These and other processes will be discussed in greater detail below.

The DC offset correction system 135 for the direct conversion receiver comprises in various embodiments a register bank or memory bank 203 that is configured to store a plurality of offset data corresponding to a plurality of gain settings for the direct conversion receiver, i.e., offset data corresponding to each of a plurality of gain settings for the variable gain amplifiers and the LNA. The DC offset correction system further comprises an offset feedback circuit 205 that is coupled to an output of the direct conversion receiver, e.g., output of the backend 107 at the outputs 131, 133 of the ADCs 129, and the register bank 203 at bus 204. The offset feedback circuit 205 is configured to controllably operate in one of a closed loop configuration and an open loop configuration and to provide an offset signal at 207 that is coupled to the direct conversion receiver, specifically the backend 107. The offset signal at 207 in various embodiments is a digital signal that can be delayed by delay stage 208 by e.g., one or more clock cycles, and then applied to digital to analog converter 127 with a resultant analog signal coupled to adder 209. The analog signal is combined with, e.g., subtracted from, the received signal and thereby shifts this signal so as to reduce or substantially eliminate any DC offset at the input to the ADCs 129. The delay stage 208 is utilized to align changes in the offset signal with corresponding changes in gain of the variable gain amplifiers so as to reduce any transients that may be seen at the input to the ADCs 129.

Additionally, the DC offset correction system 135 includes control circuitry 211 that is coupled to the register bank at 212 and the offset feedback circuit at 213. The control circuitry in various embodiments can be configured to: run the offset feedback circuit in the closed loop configuration to provide a plurality of offset data corresponding respectively to the plurality of gain settings for the direct conversion receiver; and then run the offset feedback circuit in the open loop configuration using one of the plurality of offset data that corresponds to a current gain setting. In overview, the DC offset correction system 135 normally operates in an open loop mode so as to quickly reduce DC offsets corresponding to a particular gain setting and occasionally as required and time permitting (receiver idle or not otherwise occupied) operates in a closed loop mode to provide offset data to essentially calibrate the open loop mode of operation, i.e., develop offset data for use in the open loop mode.

The control circuitry 211 is further configured to control the offset feedback circuit to operate in the closed loop configuration over a long time period or coarse time period, e.g., in one embodiment approximately 150 micro seconds, at each of the multiplicity of gain settings to generate initial or coarse offset data and to store the initial offset data that results in a non volatile memory 215. In some embodiments, the offset feedback circuit operates in the closed loop mode for the long time period at each possible gain setting for a given mode of operation and stores the resultant or coarse offset data in the register bank. Once all gain settings have been used for a given mode of operation, the contents of the register bank can be transferred to the non volatile memory and this above procedures can be repeated for each operating mode. During closed loop operation, the antenna switch and LNA can be placed in a low gain or high attenuation state. In various embodiments, the control circuitry 211 controls the offset feedback circuit to generate the initial offset data during an idle period, e.g., a product phasing process during product assembly, product provisioning at deployment, during a power up process, or upon switching from one mode of operation to another such as upon switching from operation in one frequency band to another or from one air interface protocol to another. Thus the DC offset correction system 135 can include the non volatile memory 215 which is coupled to the register bank and where, upon the direct conversion receiver initially operating in an operating mode or upon switching from one to another operating mode, the register bank 203 is loaded with corresponding initial offset data for each of the plurality of gain settings, where the corresponding initial offset data for the operating mode is retrieved from the non volatile memory 215. The retrieval process may vary with a particular embodiment of the direct conversion receiver or DC offset correction system, but will be appreciated by those of ordinary skill.

In one or more embodiments, once appropriate offset data is stored in the register bank 203, the control circuitry 211 is configured to control the feedback circuit 205 and the register bank 203, to initialize the offset feedback circuit for each of the plurality of gain settings with corresponding initial offset data from the register bank, to run the offset feedback circuit in a closed loop configuration with the direct conversion receiver set to the each of the plurality of gain settings for a short time period, e.g., in one embodiment approximately 20 micro seconds, to provide the plurality of offset data; and to save the plurality of offset data in the register bank indexed in accordance with the multiplicity of gain settings, i.e., at an address in the register bank determined by the corresponding gain setting.

In operation, the DC offset correction system, specifically the control circuitry, the register bank, and the offset feedback circuit are cooperatively configured to transfer first offset data from the register bank to the offset feedback circuit where the first offset data is associated with a first gain setting as determined by the automatic gain control (AGC) system 143 included with the direct conversion receiver and run the offset feedback circuit in the open loop configuration using the first offset data. The control circuitry, the register bank, and the offset feedback circuit are further cooperatively configured to detect a change from the first gain setting to a second gain setting as determined by the AGC system, transfer second offset data associated with the second gain setting from the register bank to the offset feedback circuit, and run the offset feedback circuit in the open loop configuration using the second offset data. Note that the control circuitry and the offset feedback circuit can be cooperatively configured and sequenced to run the offset feedback circuit in the closed loop configuration for one or more gain settings of the plurality of gain settings to update the offset data corresponding to the respective gain settings as required and time permitting, e.g., when the direct conversion receiver is idle. These and other attributes and features of the DC offset correction system 135 will be further appreciated given the more detailed description of the feedback circuit 205, register or memory bank 203 and control circuitry 211 and interaction between the same as discussed below.

The offset feedback circuit 205 in some embodiments includes a decimation filter 217 that is coupled to the output of the ADCs 129 and this filter output is then coupled to decimator 219. In one embodiment, the decimation filter is coupled to a signal with a sample rate of, e.g., 24 million samples per second (24 MHz or 24 MS/s). The decimation filter has a bandwidth corresponding to desired signal out of the decimator and filters the input signal from the ADCs 129 to reduce aliasing issues that otherwise result from decimation. The signal out of the filter is decimated by a factor of M, e.g., in one embodiment M=3 and thus one sample out of M samples is selected with the others discarded, and thus the output from the decimator is a signal at a sample rate of 24 24 MHz/M or 8 MS/s per second in one embodiment. The signal from the decimator 219 is coupled to a gain stage 221 where the gain can be adjusted to effectively control loop gain and thus loop bandwidth as will be appreciated by those of ordinary skill. The output from the gain stage is applied to a loop filter 223 that in one embodiment is essentially an integrator or Infinite Impulse Response (IIR) filter with a low corner frequency, e.g., less than 50 KHz.

The loop filter 223 also includes an apparatus to disable the filter, i.e., decouple the filter or filter output 225 from the output of the direct conversion receiver or output from the decimator 219. In one embodiment, a multiplexer 227 is used for this purpose and the control input 229 to the multiplexer 227 is utilized to control whether the DC offset correction system, specifically offset feedback circuit is operating in a closed loop configuration or mode or alternatively in an open loop configuration or mode. For example, when the control input is high or "1" the offset feedback circuit is operating in an open loop mode and the loop filter is essentially disabled. In the open loop mode or configuration, the multiplexer is loaded with the digital word or signal at the "1" input or the multiplexer and this digital signal or information after a one cycle delay is provided at the filter output 225. It will be noted that the digital signal or word at the "1" input of the multiplexer is one of the offset data that is stored in the register or memory bank 203 at an address determined or corresponding to a present gain setting at 231. After decimation by N, e.g., N=8, at decimator 229, the digital word or information, e.g., at a rate of 1 MS/s, is provided as the offset signal at 207, which is coupled to the delay stage 208 and from there to the DAC 127. The DAC 127 converts the digital offset signal to an analog offset signal which is coupled to the combiner 209 where it is subtracted from the received signal at that point.

Alternatively, when the control input is low or "0", the signal or digital information at the "0" input of the multiplexer is coupled through the multiplexer, etc., and the loop filter 223 operates normally, i.e., as a loop filter, and the DC offset correction system, specifically offset feedback circuit, is operating in a closed loop mode or configuration with the loop filter filtering or integrating the signal at the output of the decimator 219 (i.e., output of the direct conversion receiver or backend 107). The offset feedback circuit operates in a closed loop mode in order to update or calibrate offset information or data for subsequent use by the offset feedback circuit and offset correction system in an open loop mode or configuration to reduce any DC offset that would otherwise be presented to the ADCs 129. After the offset feedback circuit 205 has operated in the closed loop mode with a given gain setting for a brief period of time, the resulting offset signal at 207 is coupled to the register bank 203 and loaded into the register bank at the address corresponding to a present gain setting at 231. The register bank is loaded under control of the control circuitry 211 and loading is initiated by a load signal or pulse at 212. By repeating the closed loop operation and storing results for each of the various gain settings, the offset data in the register bank will be calibrated for the plurality of gain settings and the DC offset correction system can thereafter operate in an open loop mode using the appropriate offset data as addressed by the corresponding gain setting.

The control circuitry 211 facilitates calibrating the DC offset correction system 135 in a closed loop configuration over one or more or each of a plurality of gain settings to provide a plurality of offset data for each of one or more operating modes of the direct conversion receiver. The control circuitry further facilitates selecting one of the plurality of offset data based on a current gain setting of the direct conversion receiver and thus operating the DC offset correction system in an open loop configuration using the selected offset data to correct for any DC offsets in the direct conversion receiver where the DC offsets may be a function of the gain setting.

More specifically the control circuitry includes calibration controller 231 with input parameters and conditions; e.g., number of gain control steps at 233, coarse step period at 235, and fine step period at 237. In one embodiment the number of gain control steps is 16, the coarse step period is approximately 150 micro seconds and the fine step period is approximately 20 micro seconds. The calibration controller 231 can be hardware or software based and use a portion of the resources or capacity of a general purpose controller and software instructions as will be apparent to those of ordinary skill given the teachings and discussions herein. These parameters as well as various control signals (AGC enable, etc.) can be provided via the general purpose controller as will be appreciated. The coarse and fine step periods are provided to a multiplexer 239, which is controlled by a dc calibration mode signal at 241 to select one of the periods to be applied to a timer 243. The dc calibration mode signal selects between the coarse and fine periods. The timer 243 is enabled by the calibration controller 231 (start timer) and times out (see timeout signal) after the lapse of time equal to the period provided from multiplexer 243.

The calibration controller 231 operates as required or indicated and when the AGC system 143 is not enabled as reflected by an AGC enable signal at input to OR gate 245 and control input for multiplexer 247. When the AGC system is enabled the agc enable signal is high or true and the output from OR gate 245 at 213 is high or "1" and the input to multiplexer 247 from the AGC system is coupled through the multiplexer and presented at 231 as an input to the decoder 147 as well as address to the register or memory bank 203. The decoder 147 operates to convert a word, e.g., 4 bit word, from the AGC system to a gain setting, e.g., 1 of 6 possible gain settings, for each of variable gain amplifiers 119, 123, 127. The DC offset correction system is operated in an open loop mode. The output of the AGC system is the present gain setting for the backend variable gain amplifiers and thus the contents of the register or memory bank 203 at the location addressed by the present gain setting will be coupled to and through the multiplexer 227 and thus used via the DAC 127 and combiner or summer 209 to reduce DC offsets corresponding to the particular gain setting.

Thus operating the DC offset correction system in the open loop configuration comprises retrieving one of the plurality of offset data associated with the current gain setting, where the current gain setting is determined by an automatic gain control (AGC) system included with the direct conversion receiver and applying a value corresponding to the one of the plurality of offset data to the direct conversion receiver to reduce any DC offset out of the direct conversion receiver. Furthermore upon a change or detecting a change from the current gain setting to a second gain setting at 231 as determined by the AGC system, second offset data associated with the second gain setting, i.e., stored in the register bank at the address designated by the second gain setting, is retrieved and coupled via the multiplexer 223 to 207 and thus a value corresponding to the second offset data is applied to the direct conversion receiver, i.e., via the DAC 127 and summer 209.

In the closed loop configuration, the offset feedback circuit 205 and control circuitry 211 generally operate to calibrate the DC offset correction system, i.e., develop offset data for use in an open loop configuration for correcting DC offsets. In various embodiments there can be a plurality of calibration modes, e.g., a coarse and fine DC offset calibration mode. For example, if no offset data is available or there is no confidence in the offset data that is available a coarse calibration process can be used, wherein the offset feedback circuit 205 is operated in a closed loop mode for a longer period of time, e.g., coarse step period, to develop or provide offset data. If offset data exists but this data needs or may need to be updated, e.g., due to variations over temperature or voltage which may be detected via sensors (not specifically depicted), the offset feedback circuit 205 is operated in a closed loop mode for a shorter period of time, e.g., fine step period. Calibration is handled by the calibration controller. During calibration the AGC system is disabled (agc enable signal is low) and thus multiplexer 247 is coupled to the calibration controller and the output of OR gate 245 depends on the signal at 249.

By way of example, the calibration controller 231 steps through all possible gain settings, e.g., 16 gain settings, with each setting applied via the multiplexer 247 output at 231 to the decoder 147 as well as address bus to the register or memory bank 203 and state change detector 251. As the gain setting changes, the state change detector 251 detects or observes the change and generates a pulse signal which is delayed by delay stage 253 and then applied to OR gate 245. The resultant output of OR gate 245 at 213 is used to enable and thus initialize the multiplexer 227 and the loop filter 223 with the contents of the register bank from the location indicated by present gain setting. The delay stage is set to insure that the proper offset data is available from the register bank, before the multiplexer is enabled. Once the pulse signal returns to zero, the loop filter, i.e., offset feedback circuit 205 and DC offset correction system operates in a closed loop mode or configuration for a time period determined by the timer 243. While the system is operating in a closed loop mode the DC offset is being reduced or eliminated and offset data at 207 is being generated. When the timer time outs the calibration controller generates a load register signal at 212 and the register location corresponding to the present gain setting is loaded with the offset data at 207. This offset data has been calibrated to account for current conditions (temperature, age, etc.) of the direct conversion receiver, specifically backend 107. After loading the register, the calibration controller 231 steps to the next gain setting and the above processes are repeated.

Thus the method of calibration or calibrating the offset correction system includes in one or more embodiments in addition to or as part of the calibrating the DC offset correction system, storing the plurality of offset data in the memory or register bank 203 with a plurality of locations corresponding to the plurality of gain settings. In operation in the open loop mode, selecting appropriate offset data comprises retrieving the one of the plurality of offset data from a location in the memory bank that is identified by the current gain setting.

Before any operation, initializing the DC offset correction system with a plurality of initial offset data that is retrieved from a memory, e.g., NVM 215, can be performed. The initial offset data is usually dependent on the operating mode, e.g., one of a plurality of frequency bands or the like, and the plurality of initial offset data corresponds, respectively, to the plurality of gain settings and may be used as an initial starting point for calibrating or fine calibrating the DC offset correction system. For example, the initializing the DC offset correction system with the plurality of initial offset data can be undertaken, upon switching to the operating mode from another operating mode, by retrieving from the memory (NVM 215), initial offset data for each of the plurality of gain settings where the initial offset data corresponds to the new operating mode.

In various embodiments the DC offset correction system is set up or coarse calibrated by generating a plurality of coarse offset data. The coarse offset data is provided or generated by operating, during a coarse calibration procedure, the DC offset correction system and the direct conversion receiver in a closed loop configuration (AGC system disabled) over a long time period, e.g., coarse step period, in each of the plurality of gain settings and storing the plurality of coarse offset data that results in a memory. Each coarse offset data point is initially stored in the register or memory bank and once the coarse calibration is finished for all gain settings for a given operating mode, the contents of the register bank are transferred to the NVM 215 using known procedures. These processes can be repeated for each operating mode of the receiver. The generating the plurality of coarse offset data can be undertaken during, e.g., a production testing or tuning process, a provisioning or customer deployment process, a power up process once the product has been fielded or deployed, or the like.

Thereafter, calibrating or fine calibrating the DC offset correction system over each of the plurality of gain settings can start with coarse offset data corresponding (possibly to an operating mode and) to each of the plurality of gain settings. Thus calibrating or fine calibrating the DC offset correction system further comprises, for one or each one of the plurality of gain settings, initializing the DC offset correction system with corresponding past offset data, operating the DC offset correction system in a closed loop configuration with the direct conversion receiver set to the one of the plurality of gain settings for a short time period, e.g., fine step period, to provide fine offset data for the one of the plurality of gain settings, and saving, within the register or memory bank 203, the fine offset data indexed to the corresponding one of the plurality of gain settings. As earlier noted, when the direct conversion receiver is idle, the calibrating or re-calibrating the DC offset correction system can be performed for one or more gain setting of the plurality of gain settings. Note also that the coarse offset data can be obtained using a closed loop configuration of the DC offset correction system, specifically offset feedback circuitry, with a different bandwidth setting, e.g., normally narrower bandwidth setting, via the Band width control and amplifier 221 that when the fine calibrating is performed in a closed loop configuration.

Figure 3:
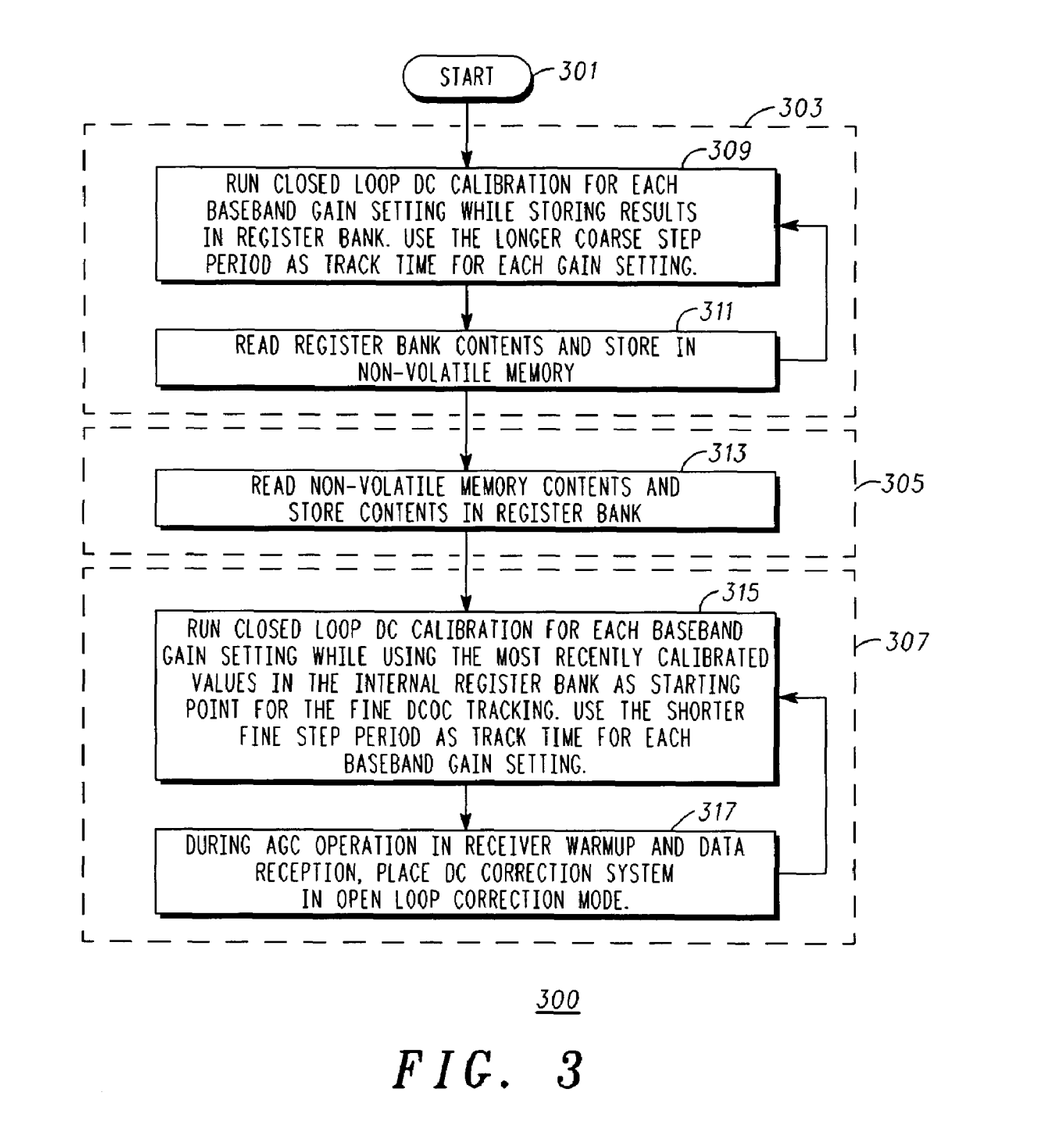
FIG. 3 shows a flow chart illustrating representative embodiments of methods of or associated with offset correction in the receiver of FIG. 1 or FIG. 2 in accordance with one or more embodiments.

Referring to FIG. 3, a flow chart illustrating representative embodiments of methods of or associated with offset correction in the receiver of FIG. 1 or FIG. 2 in accordance with one or more embodiments will be discussed and described. It will be appreciated that the methods of FIG. 3 use many of the inventive concepts and principles discussed in detail above and thus this description will be somewhat in the nature of a summary with various details generally available in the earlier descriptions. This method is shown at an overview level and can be implemented in one or more of the structures or apparatus described earlier or other similarly configured and arranged structures. Various descriptions of detailed processes, etc. are described above in the context of the exemplary embodiments of FIG. 1 and FIG. 2.

The method 300 is directed to DC offset correction in a direct conversion receiver and starts at 301. After starting, 303 is directed to a coarse calibration process that is performed in a closed loop mode or configuration for each possible operating frequency band or operating mode and results in offset data or calibration data for each gain setting of a plurality of gain settings. The offset data for all gain settings and a given operating mode is initially stored in the register or memory bank and then is transferred to and stored in the NVM with these processes repeated for each possible operating mode. The coarse calibration process can be performed, e.g., as part of a production phasing and calibration process or at another opportune time, when the associated receiver is not otherwise being utilized. Typically when this process is performed the direct conversion receiver front end, e.g., antenna switch and LNA, can be placed in a low gain state to avoid any noise or other interference during the calibration process.

After coarse calibration, when the direct conversion receiver is powered up or when the operating mode (frequency band, etc) changes from one mode to another, 313 shows retrieving, from NVM, a set or plurality of offset data corresponding to the present operating mode and storing the offset data that is retrieved in a register or memory bank. Note that this operation can be undertaken at other times when the receiver is not otherwise occupied (i.e., receiver is idle).

After retrieving the offset data from NVM, another calibration process can be performed and then the DC offset correction system is operated in an open loop mode, using the offset data that results from the calibration procedures 307. The other calibrating process may be referred to as fine calibrating the DC offset correction system. The fine calibration can be performed during low activity levels for the receiver, i.e., when the receiver is or is nearly idle. Normally fine calibration is performed using a shorter time period, e.g., fine step period.

In more detail, 303 comprises running the DC offset correction system in a closed loop mode for each base band gain setting and storing each of the resultant offset data in the register bank 309 at a location indexed to the corresponding gain setting. Once offset data for each of the gain settings has been determined or calibrated, the set of offset data is read from the register bank 311 and stored in the NVM.

In more detail, 307 comprises calibrating the DC offset correction system in a closed loop configuration 315 over each of a plurality of gain settings to provide a plurality of offset data for the operating mode (from 313) of the direct conversion receiver. This is normally done after initializing the DC offset correction system with the most recently calibrated values or offset data and performed using a short time period, e.g., fine step period, for each gain setting. As calibrated offset data is developed or provided, this offset data is stored in the register bank and a location corresponding to the associated gain setting. Given the offset data resulting from the fine calibration procedure, 317 indicates operating the DC offset correction system in an open loop configuration using one of the plurality of offset data that has been selected based on a current gain setting of the of the direct conversion receiver to correct for a DC offset in the direct conversion receiver. The gain setting is provided by the AGC system of the receiver.

Figure 4:
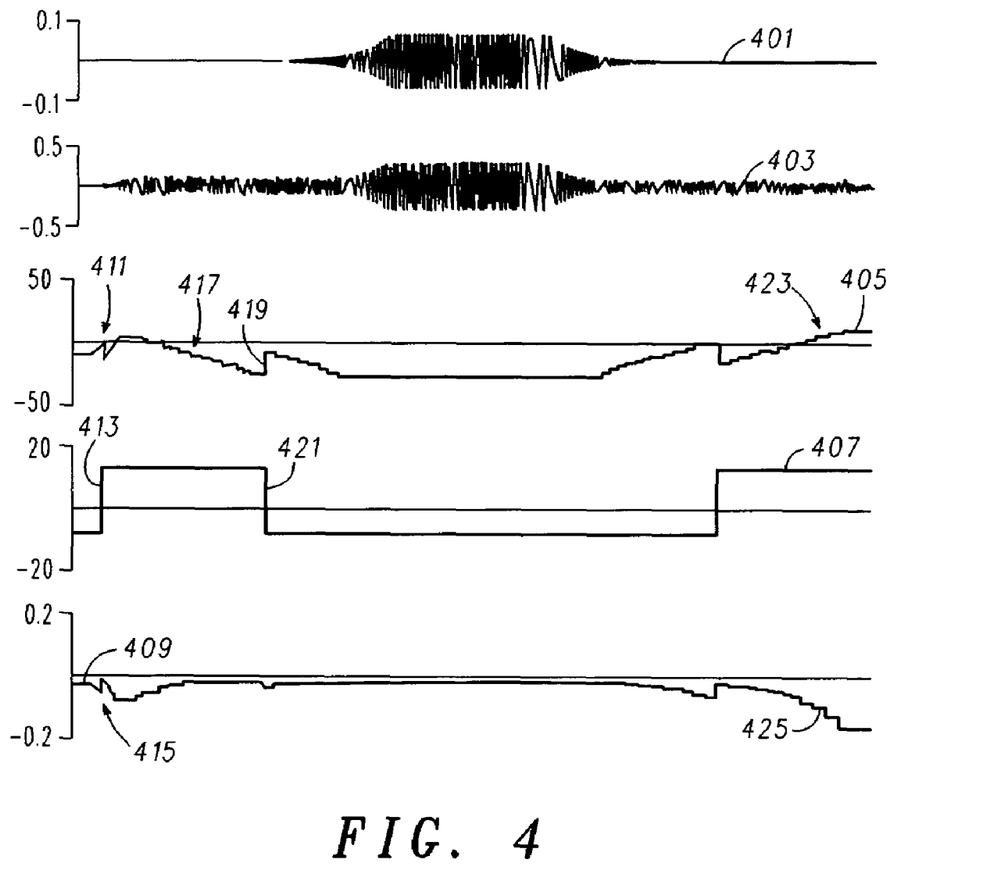
FIG. 4 shows various simulated performance data for a DC offset correction system in accordance with one or more embodiments.

Referring to FIG. 4, various simulated performance data for a DC offset correction system in accordance with one or more embodiments will be discussed and described. Generally FIG. 4 illustrates the operation of the DC offset correction system in a direct conversion receiver as an input signal is applied and as the level or amplitude of the input signal 401 is ramped up, stabilized in the center of the graph (no change in amplitude), and then ramped down. It will be evident that the DC correction system is operating in an open loop configuration or mode and the AGC system is active and providing gain settings. The level of the signal 403 that is presented to the ADCs 129 (real or in phase portion) similarly rises until the AGC system begins to control the gain of the direct conversion receiver and remains essentially constant until the AGC system runs out of control 404 at which point the level rises with the level of the input signal 401. It is evident that the DC offset or DC level in the signal 403 is near zero and thus the offset correction appears to be working and reducing DC offset.

The composite gain 405 of the variable gain amplifiers in the backend 107 varies with the input signal level, and the gain setting 407 for the LNA. The DC offset value that is available from the DAC 409 is adjusted or changed with the gain setting 405. The AGC system is initially in an attack mode 411 and operates to quickly establish appropriate gain settings including gain replacement 413 where the gain of the LNA is increased with a corresponding small gain reduction in the composite gain of the backend 107. A change in DC offset values 415 corresponding to the AGC attack or capture mode 411 is also observed. As the input signal level continues to ramp up the gain settings or composite gain 405 is progressively reduced 417. This is followed by an abrupt increase 419 as the input signal level reaches a point where the LNA amplifier gain is switched out 421. As the input signal level is ramped down to a low level, the composite gain continues to be increased 423 and the DC offset value 425 corresponding to these large gain values in the backend increase significantly in a negative direction.

As can be seen from the plots, the track time of the DC offset correction system is able to track the AGC system with little if any transients observable at the ADC inputs and with little if any observable DC offset remaining at the ADC input. Thus these techniques can reduce the DC offset in a direct conversion receiver very rapidly. Traditional methods normally take too long to track out or mitigate a DC offset under realistic scenarios since the loop bandwidth for a closed loop DC offset correction system preclude rapid enough response to track fast signal variations, e.g., experienced with intermittent received signals or with channel fading conditions.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of DC (direct current) offset correction in a direct conversion receiver, the method comprising:
   calibrating a DC offset correction system in a closed loop configuration over each of a plurality of gain settings to provide a plurality of offset data for an operating mode of the direct conversion receiver;
   selecting one of the plurality of offset data based on a current gain setting of the direct conversion receiver;
   operating the DC offset correction system in an open loop configuration using the one of the plurality of offset data to correct for a DC offset in the direct conversion receiver; and
   generating a plurality of coarse offset data by operating, during a coarse calibration procedure, the DC offset correction system and the direct conversion receiver in a closed loop configuration over a long time period in each of the plurality of gain settings and storing the plurality of coarse offset data that results in a memory and wherein the calibrating the DC offset correction system over each of the plurality of gain settings starts with coarse offset data corresponding to the each of the plurality of gain settings.

2. The method of claim 1 further comprising storing the plurality of offset data in a memory bank with a plurality of locations corresponding to the plurality of gain settings and wherein the selecting comprises retrieving the one of the plurality of offset data from a location in the memory bank identified by the current gain setting.

3. The method of claim 1 where the operating the DC offset correction system in an open loop configuration further comprises retrieving the one of the plurality of offset data associated with the current gain setting, the current gain setting determined by an automatic gain control (AGC) system included with the direct conversion receiver and applying a value corresponding to the one of the plurality of offset data to the direct conversion receiver to reduce any DC offset out of the direct conversion receiver.

4. The method of claim 3 further comprising upon a change from the current gain setting to a second gain setting as determined by the AGC system, retrieving second offset data associated with the second gain setting, and operating the DC-offset correction system in the open loop configuration using the second offset data.

5. The method of claim 1 further comprising initializing the DC offset correction system with a plurality of initial offset data that is retrieved from a memory and is dependent on the operating mode of the direct conversion receiver, the plurality of initial offset data corresponding, respectively, to the plurality of gain settings and used as an initial starting point for the calibrating the DC offset correction system.

6. The method of claim 5 where the initializing a DC offset correction system with the plurality of initial offset data further comprises, upon switching to the operating mode from another operating mode, retrieving from the memory, initial offset data for each of the plurality of gain settings.

7. The method of claim 1 where the generating the plurality of coarse offset data comprises generating the plurality of coarse offset data during one or more of a provisioning process and a power up process.

8. The method of claim 1 further comprising repeating, when the direct conversion receiver is idle, the calibrating the DC offset correction system at least for one gain setting of the plurality of gain settings.

9. The method of claim 1 where the operating mode comprises one of a plurality of frequency bands and the direct conversion receiver includes a plurality of variable gain amplifiers with each gain setting including a specific gain setting for each of the variable gain amplifiers.

10. A method of DC (direct current) offset correction in a direct conversion receiver, the method comprising:
    calibrating a DC offset correction system in a closed loop configuration over each of a plurality of gain settings to provide a plurality of offset data for an operating mode of the direct conversion receiver;
    selecting one of the plurality of offset data based on a current gain setting of the direct conversion receiver; and
    operating the DC offset correction system in an open loop configuration using the one of the plurality of offset data to correct for a DC offset in the direct conversion receiver,
    where the calibrating the DC offset correction system further comprises, for one of the plurality of gain settings, initializing the DC offset correction system with corresponding past offset data, operating the DC offset correction system in a closed loop configuration with the direct conversion receiver set to the one of the plurality of gain settings for a short time period to provide fine offset data for the one of the plurality of gain settings, and saving the fine offset data indexed to the corresponding one of the plurality of gain settings.

11. A direct current (DC) offset correction system for a direct conversion receiver, the DC offset correction system comprising:
    a register bank configured to store a plurality of offset data corresponding to a plurality of gain settings for the direct conversion receiver;
    an offset feedback circuit, coupled to an output of the direct conversion receiver and the register bank and configured to controllably operate in one of a closed loop configuration and an open loop configuration and to provide an offset signal that is coupled to the direct conversion receiver; and
    control circuitry coupled to the register bank and the offset feedback circuit and configured to: run the offset feedback circuit in the closed loop configuration to provide a plurality of offset data corresponding respectively to the plurality of gain settings for the direct conversion receiver; and then run the offset feedback circuit in the open loop configuration using one of the plurality of offset data that corresponds to a current gain setting,
    where the control circuitry is further configured to control the offset feedback circuit to operate in the closed loop configuration over a long time period at each of the multiplicity of gain settings to generate initial offset data and to store the initial offset data that results in a non volatile memory.

12. The DC offset correction system of claim 11 where the control circuitry controls the offset feedback circuit to generate the initial offset data during at least one of a product phasing process and a power up process.

13. The DC offset correction system of claim 11 further comprising a non volatile memory coupled to the register bank where, upon the direct conversion receiver operating in an operating mode, the register bank is loaded with corresponding initial offset data for each of the plurality of gain settings, where the corresponding initial offset data for the operating mode is retrieved from the non volatile memory.

14. The DC offset correction system of claim 11 where the control circuitry, the register bank, and the offset feedback circuit are cooperatively configured to transfer first offset data from the register bank to the offset feedback circuit, the first offset data associated with a first gain setting as determined by an automatic gain control (AGC) system included with the direct conversion receiver and run the offset feedback circuit in the open loop configuration using the first offset data.

15. The DC offset correction system of claim 14 where the. control circuitry, the register bank, and the offset feedback circuit are cooperatively configured to detect a change from the first gain setting to a second gain setting as determined by the AGC system, transfer second offset data associated with the second gain setting from the register bank to the offset feedback circuit, and run the offset feedback circuit in the open loop configuration using the second offset data.

16. The DC offset correction system of claim 11 where the control circuitry and the offset feedback circuit are cooperatively configured to run the offset feedback circuit in the closed loop configuration at least for one gain setting of the plurality of gain settings to update the offset data corresponding to the at least one gain setting when the direct conversion receiver is idle.

17. A direct current (DC) offset correction system for a direct conversion receiver, the DC offset correction system comprising:
    a register bank configured to store a plurality of offset data corresponding to a plurality of gain settings for the direct conversion receiver;
    an offset feedback circuit, coupled to an output of the direct conversion receiver and the register bank and configured to controllably operate in one of a closed loop configuration and an open loop configuration and to provide an offset signal that is coupled to the direct conversion receiver; and
    control circuitry coupled to the register bank and the offset feedback circuit and configured to: run the offset feedback circuit in the closed loop configuration to provide a plurality of offset data corresponding respectively to the plurality of gain settings for the direct conversion receiver; and then run the offset feedback circuit in the open loop configuration using one of the plurality of offset data that corresponds to a current gain setting,
    where the control circuitry is configured to control the feedback circuit and the register bank, to initialize the offset feedback circuit for each of the plurality of gain settings with corresponding initial offset data from the register bank, to run the offset feedback circuit in a closed loop configuration with the direct conversion receiver set to the each of the plurality of gain settings for a short time period to provide the plurality of offset data; and to save the plurality of offset data in the register bank indexed in accordance with the multiplicity of gain settings.

18. The DC offset correction system of claim 17 wherein the control circuitry is further configured to respond to a change, from a first gain setting to a second gain setting for the direct conversion receiver by operating in the open loop mode using second offset data corresponding to the second gain setting.

19. The DC offset correction system of claim 17 wherein the control system is further configured to respond to at least one of a change in temperature, change in voltage, or lapse of time to repeat the operation in a closed loop configuration at each of the plurality of gain settings to provide a corresponding plurality of offset data.

* * * * *